(12) United States Patent
Siri

(10) Patent No.: US 10,839,250 B2
(45) Date of Patent: Nov. 17, 2020

(54) PROCESS AND SYSTEM FOR COMPUTING THE COST OF USABLE AND CONSUMABLE MATERIALS FOR PAINTING OF MOTOR VEHICLES, FROM ANALYSIS OF DEFORMATIONS IN MOTOR VEHICLES

(71) Applicant: Uesse S.R.L., Genoa (IT)

(72) Inventor: Fausto Siri, Genoa (IT)

(73) Assignee: Uesse S.R.L., Genoa (IT)

( * ) Notice: Subject to any disclaimer, the term of this patent is extended or adjusted under 35 U.S.C. 154(b) by 104 days.

(21) Appl. No.: 16/099,585

(22) PCT Filed: Apr. 26, 2017

(86) PCT No.: PCT/IT2017/000085
§ 371 (c)(1),
(2) Date: Nov. 7, 2018

(87) PCT Pub. No.: WO2017/195229
PCT Pub. Date: Nov. 16, 2017

(65) Prior Publication Data
US 2019/0188523 A1     Jun. 20, 2019

(30) Foreign Application Priority Data

May 9, 2016   (IT) .................. 102016000047043

(51) Int. Cl.
*G06K 9/62*       (2006.01)
*G06Q 10/08*      (2012.01)
(Continued)

(52) U.S. Cl.
CPC ......... *G06K 9/6206* (2013.01); *G06K 9/3233* (2013.01); *G06Q 10/04* (2013.01);
(Continued)

(58) Field of Classification Search
None
See application file for complete search history.

(56) References Cited

U.S. PATENT DOCUMENTS 5,293,309 A * 3/1994 Sakai ................. G06Q 10/0875
                                                 705/29
9,824,453 B1 * 11/2017 Collins .............. G06K 9/00671
(Continued)

*Primary Examiner* — Vikkram Bali
(74) *Attorney, Agent, or Firm* — Macheledt Bales LLP; Jennifer L. Bales

(57) ABSTRACT

A system and a process are described for computing the cost of usable and consumable materials for painting motor vehicles, from the analysis of deformations in the motor vehicles, the process comprising the following steps: loading image data relevant for a three-dimensional image of a damaged vehicle in a vehicle images memory; in the images memory of the damaged vehicles, recalling the image data of at least one three-dimensional image of a sample vehicle from a database of images of sample vehicles; automatically comparing the three-dimensional image of the damaged vehicle with the corresponding three-dimensional image of the sample vehicle identifying, through an automatic comparison between the two images: damage position or deformation and detecting the distorted regions; selecting through graphical tools for delimiting or pointing out the damaged or distorted regions identified from the automatic comparison on at least one of the two images; computing perimeter, area and/or volume from the damaged or distorted region or regions; computing a deformation severity degree and assigning the deformation severity degree to every damaged or distorted region; computing labor times and costs for repairing the damaged or distorted area; and producing a virtual image of the sample vehicle.

8 Claims, 3 Drawing Sheets

(51) Int. Cl.
*G06Q 10/04* (2012.01)
*G06Q 10/06* (2012.01)
*G06K 9/32* (2006.01)
*G06Q 30/02* (2012.01)
*G06T 17/20* (2006.01)
*G06F 30/00* (2020.01)
*G06F 30/15* (2020.01)

(52) U.S. Cl.
CPC ............. *G06Q 10/06* (2013.01); *G06Q 10/08* (2013.01); *G06Q 30/0206* (2013.01); *G06T 17/20* (2013.01); *G06F 30/00* (2020.01); *G06F 30/15* (2020.01)

(56) References Cited

U.S. PATENT DOCUMENTS

| | | | |
|---|---|---|---|
| 10,636,148 B1* | 4/2020 | Chen | G06T 3/40 |
| 2005/0096515 A1* | 5/2005 | Geng | G06T 7/33 |
| | | | 600/315 |
| 2008/0267487 A1* | 10/2008 | Siri | G06Q 90/00 |
| | | | 382/141 |
| 2014/0316825 A1* | 10/2014 | van Dijk | G06Q 40/08 |
| | | | 705/4 |
| 2018/0260793 A1* | 9/2018 | Li | G06Q 30/0283 |

\* cited by examiner

PROCESS AND SYSTEM FOR COMPUTING THE COST OF USABLE AND CONSUMABLE MATERIALS FOR PAINTING OF MOTOR VEHICLES, FROM ANALYSIS OF DEFORMATIONS IN MOTOR VEHICLES

BACKGROUND OF THE INVENTION

1) Field of the Invention

The present invention relates to a process for computing the cost of usable and consumable materials for painting of motor vehicles, from the analysis of deformations in the motor vehicles.

2) Background Art

Processes of the above mentioned type are known and widely used, but has a major problem.

According to prior processes, for computing the cost of usable and consumable materials, painting houses are multiplied by a conventionally and arbitrarily established parameter, which changes from area to area (for example: in Milan the parameter is 20 Euros per hour, in Turin 16 Euros, in Naples 11 Euros, etc.). Manufacturers of painting products has software available which is capable of computing the amount of product to be applied, but compute it for the whole sheet metal (for example, door or fender): actually, such amount is not even computed, since the pieces of software have the so-called "cost per panel", which however is not correct, since the damaged part to be repainted is not the whole panel, but only a part thereof.

SUMMARY OF THE INVENTION

The present invention aims to provide a process and a system, according to the respective independent claims, for computing the cost of usable and consumable materials from the analysis of deformations in motor vehicles, by computing the cost for square centimeter (or square decimeter) of the materials to be used: in this way, having the unit cost per kg of paint available, one manages also to more accurately quantify the cost of the material to be used, for example on two similar damages, but in cats with different colors (while now, since only painting hours multiplied by the parameter are computed, what is quantified is the same, independently from the color).

A further object of the present invention is providing a process and a system as described above, which can be operatively connected to a dye-meter, so that, taken from the dye-meter the formula for painting a square centimeter, the exact amount of product to be communicated to the dye-meter can be determined, for painting the selected portion and nothing else: this is important, since it reduces wastes and environmental impacts (disposal of unused residues), in addition to providing a cost saving.

It is intended that the enclosed claims are an integral part of the present description.

BRIEF DESCRIPTION OF THE DRAWINGS

The features of the invention and the advantages deriving therefrom will be clearer from the following detailed description of the enclosed figures, wherein.

DETAILED DESCRIPTION OF PREFERRED EMBODIMENTS

Figure 1:
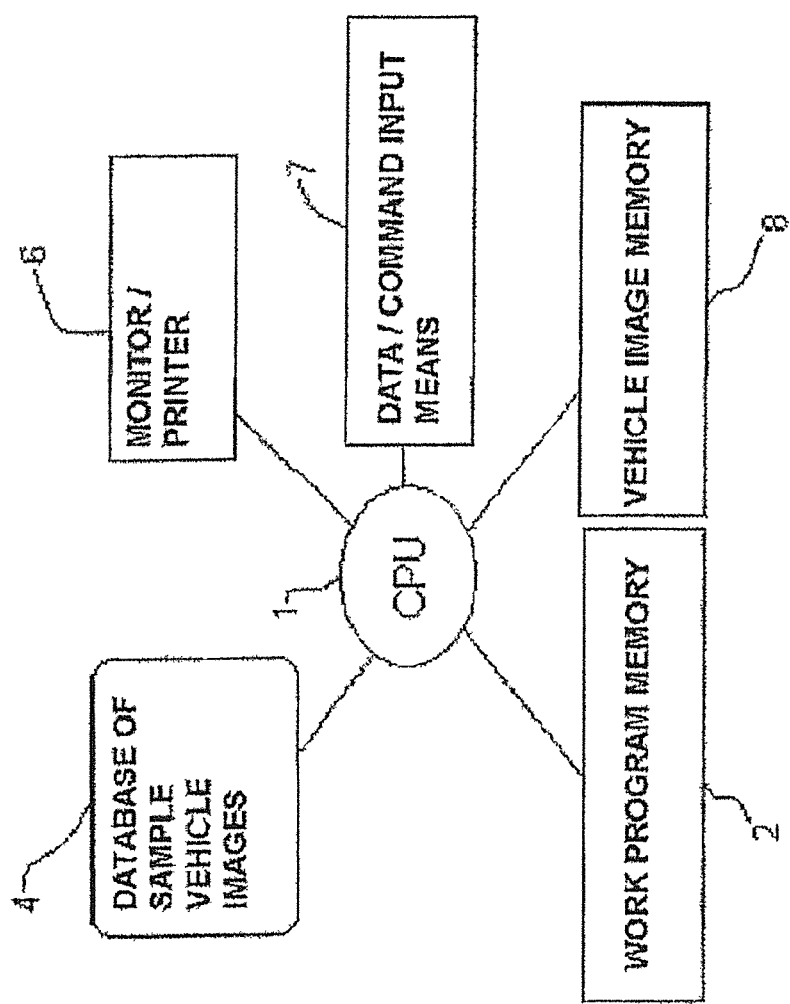
FIG. 1 is a block diagram of the main element of the system according to the present invention.

In the system of FIG. 1, an operator inserts and loads in the vehicle images memory 8 a three-dimensional image of the damaged vehicle through means for inserting data or commands 7; afterwards, the operator recalls in the images memory of the damaged vehicle a three-dimensional image of the sample vehicle from the database of images of sample vehicles 4, said image of sample vehicle corresponding to the image of the damaged vehicle, namely the two vehicles must be of the same make, model and type. Through the working program, the CPU compares the three-dimensional image of the damaged vehicle with the corresponding three-dimensional image of the sample vehicle identifying by comparison said two images: the location of the damage or deformation and the detection of the distorted regions. Then, the CPU through the working program, stores the results of said comparison in the memory of working programs and, through algorithms implemented from the working program, it computes the area and/or the volume, and/or identifies the position in the space of the damage on the vehicle by using the computing algorithm implemented from the working program on the distorted regions and/or on the results of said comparison stored in the memory of working programs. Therefore, it is clear that, in order to advantageously compute the volume of the distorted or damaged region, three-dimensional images are used, allowing the CPU to automatically compute the deformation depth in comparison with the corresponding three-dimensional image of the sample vehicle.

A scanning unit 9 is further provided. The operation of the scanning unit 9 provides for a scanning of a vehicle, preferably with a laser, giving as result an array of image data or a three-dimensional image of the vehicle, which identifies the points composing the contour of the vehicle.

In the selection in automatic mode, the working program compares the image of the damaged vehicle with all images of the database of sample vehicles and recalls from the database of images of sample vehicles the three-dimensional image of the sample vehicle, which by comparison corresponds much more in the points with the image of the damaged vehicle.

In the automatic selection mode, once the two images of the damaged vehicle and of the sample vehicle are present in the memory of vehicles, through the working program the CPU compares the three-dimensional images of the damaged vehicle and of the corresponding sample vehicle detecting the points where a deformation or difference occurs.

The results of said comparison between images of damaged vehicle and images of sample vehicle are then inserted in the memory unit of the working program, which, through the CPU for every point and/or small area, identifies the occurred deformation, and computes the perimeter, area of damaged region and/or deformation volume and/or deformation depth through known algorithms.

According to a preferred solution, it is possible to provide that, upon request of the program, the operator inserts an agreement or refusal command for said sample vehicle chosen from the CPU and displayed on the monitor by the operator, in order to have a confirmation of the automatic selection from the CPU through the working program.

Regarding the definition/selection/computation of the damaged or distorted areas and/or of the volumes, a dimension and/or an area and/or a volume of damaged regions of a particular type of vehicle are stored in the working memory.

The working program is such that the CPU identifies through various forms, parts which compose a vehicle and combines them with predetermined identification codes of the vehicle parts, for example identifying whether the damage is on the doors or on other different parts of the vehicle.

According to the present invention, the CPU is provided for interacting with a database of parts composing the vehicle, every part being identified by a code.

The working program through the database and the selection of parts is capable of locating the damage with reference to the vehicle parts which are distorted on in any way damaged.

Therefore, the CPU through the working program produces and combines on every vehicle part affected by the deformation or damage a severity degree of the deformation proportional to the deformation itself, namely the dimension and/or the area and/or the volume of the damaged part.

The database of vehicle parts provides in combination for an additional database of times and/or costs to replace and repair parts, and thereby the system through the CPU and the working program provides for evaluating the cost and the necessary operations for reconstructing the part by comparison with a database of times and costs of motor vehicle parts.

In particular, the evaluation of times and costs is preferably divided into three steps: repairing the metallic sheet, or working the metallic sheet, painting and assembling/disassembling the parts.

The database of times and costs of the motor vehicle parts for every motor vehicle part has preferably a minimum evaluation and a maximum evaluation of the necessary time and/or cost for repairing the metallic sheet, or working the metallic sheet and/or painting and/or assembling/disassembling parts and for every motor vehicle part further has a list of parts to be disassembled/reassembled for disassembling/reassembling every single part.

Thereby, the system combines on every damaged part an evaluation of time and/or cost preferably divided into said three steps (repairing the metallic sheet, or working the metallic sheet, painting and assembling/disassembling of parts), said evaluation being chosen automatically, through dedicated working algorithms, from the CPU in the range which goes from said minimum evaluation to said maximum evaluation of the necessary time and/or cost proportionally to the severity degree of the deformation or damage assigned to every part.

Therefore, the system sums necessary costs/times for the three steps of every part of damaged vehicle and points out the obtained results through said unit for displaying the results, preferably through a monitor.

For every damaged part, the system compares said sum of costs/times necessary for repairing with the necessary cost/time to completely replace said damaged part with a new part, and preferably automatically chooses to replace said damaged or distorted part or whether repairing the same part by choosing the minimum cost/time.

Also in this case, the system shows the obtained results through a displaying units for results, possibly requesting the operator for a confirmation of the preferred choice.

It is also possible to provide the system connected to a database of motor vehicles parts in a warehouse so that the system compares the parts to be replaced with the parts in the warehouse, producing a report with available parts/unavailable parts, and possibly producing an order on paper or electronically to supply the warehouse with parts taken for replacements and/or unavailable parts.

The invention further provides for a process for automatically identifying, analyzing and estimating deformations in motor vehicles, said process comprising the following steps:

loading image data relevant for at least one three-dimensional image of a damaged vehicle in a vehicle images memory;

in the images memory of the damaged vehicles, recalling the image data of at least one three-dimensional image of a sample vehicle from a database of images of sample vehicles, said image of sample vehicle being the image of a type of vehicle corresponding to the type of damaged vehicle;

displaying image data relevant for the image of damaged vehicle and the corresponding type of undamaged vehicle;

automatically comparing the three-dimensional image of the damaged vehicle with the corresponding three-dimensional image of the sample vehicle identifying, through an automatic comparison between said two images: damage position or deformation and detecting the distorted regions;

selecting through graphical tools for delimiting or pointing out the damaged or distorted regions identified by the automatic comparison on at least one of the two images;

storing image pixels and respective image data selected as corresponding to the damaged or distorted regions as result of said comparison in a memory of a working program;

computing perimeter, area and/or volume from the damaged or distorted region or regions and/or further morphologic parameters through algorithms implemented by a working program, and/or identifying the position in space of the damage on the vehicle using the computing algorithm implemented from the working program on distorted regions and/or on results of said comparison stored in the memory of working programs;

computing a deformation severity degree and assigning said deformation severity degree to every damaged or distorted region;

computing labor times and costs for repairing the damaged or distorted area, starting from such computed perimeter, area and/or volume and/or morphologic parameters, using a database of available repair times and costs for every type of vehicle; and producing a virtual image of the sample vehicle, which is composed of the set of virtual images of the single structural parts of the vehicle, which form independent structural units, namely single parts of the vehicle, which virtual image is displayed as image of the assembled vehicle or as image of the exploded vehicle, every structural part of the vehicle being univocally identified by an identifying code, and corresponding to the same structural part of the damaged vehicle;

wherein the step of computing perimeter, area and/or volume from the damaged or distorted region or regions and/or further morphologic parameters, and/or identifying the position in space of the damage on the vehicle is performed through the following steps:

acquiring data through laser scanning, wherein the laser scanning technology digitally acquires three-dimensional objects of various sizes as clouds of points. The geometric digital description of the object is discrete: the greater the resolution set for acquiring, the denser the cloud of points, and therefore the showing detail, will be. Each point is defined by a space position with coordinates x y z with respect to the point of origin represented by the scanner position and, if the scanner is capable of also detecting the photographic mapping of the object (through an embedded digital photo-camera), from the RGB value, therefore from the chromatic value of the acquired point. As regards the types of scanner, 3D laser scanners can fundamentally employ two measuring types: the flight time, for big objects spaced by 2 m to over about 150 m (palaces, squares, monuments), or the optical triangulation, for very high resolution scans of objects with reduced sizes placed at a distance from about 0.6 to 25 m. The scan resolution ranges depending on the type of instruments and on the aims of use, from sub-millimeter values (down to 0.21 mm) of the scanner, which use the optical triangulation, to millimeter or centimeter values of flight time scanners.

post-processing data: after having acquired data, a series of operations are performed, which allow 3D displaying for the performed acquisition.

Herein below, the various performed steps are included, in execution order:

a) Aligning of Scans and Recording

Each scan produces a cloud of points, which partially describe the object, both because the emitted laser ray etches the object from a particular angle (point of view), and therefore the hidden surfaces will remain occluded also when digitally acquiring, and because the visual scanner field is limited to a certain angle (generally 40°-60°). For this reason, it is necessary to perform numerous scans to obtain a total acquiring coverage.

To be able to align and re-compose in a global showing the partial clouds of points obtained from each scan, it is necessary that the various scans have common overlapping zones (at least about 30%) comprising object points which are easily recognizable. When aligning (or recording) the partial clouds, it will be necessary to point out to the software which are the common connecting points on which the various scans has to be correctly aligned.

In order to work with a better accuracy, "aims" or "targets" with various shapes and sizes (spherical, with plane disk, etc.) can be used, which are generally supplied with the scanner, and are therefore part of a proprietary system, which automatically recognizes and classifies them, through software, as soon as every single acquisition ends.

A potentially even more accurate recording system provides for the use of topographic data (detection of position, of well recognizable points of the object or target).

b) Cleaning the Cloud of Points and Filtering the Noise

Isolated points are removed, and the noise produced by the standard deviation of the scanner is cancelled.

c) Triangulation and Building of the Mesh

This is a very delicate operation whose good result depends on the quality of acquired data.

d) Closing of Mesh Holes and Correcting the Anomalous Faces

Often, due to noise or absence of data in the meshes, which have to be integrated, in the final model there are empty spots or "holes". They are undesired from an aesthetic point of view and as regards the attempt of reproducing the real object as faithfully as possible.

e) Applying Textures to the 3D Model

The final result of applying a texture must appear as perfect overlapping and an accurate geometric correspondence, with respect to the real surface of the object.

Displaying the Obtained Result

Purpose of displaying is making the acquired data capable of being interpreted in the best possible way.

As regards management and structure of 3D data, in modern data acquiring and managing systems, the 3D scan produces, in a more or less direct way, a series of triplets of coordinates, each one corresponding to each acquired point.

The obtained values can be organized in a rectangular matrix, actually an image, called RI (Range Image, namely n×m grids of distances which describe a surface with cylindrical or Cartesian coordinates), in which each pixel assumes a depth value with respect to a reference point or plane. The placement of the pixel in the grid determines the position of the point on the reference surface.

The thereby organized data have the strong operating advantage of their compactness. For each point, in fact, it is enough to store only the depth piece of information to reconstruct the Cartesian triplet, which describes its coordinates.

This representation of the object is however intrinsic, since referred to the point of view which generated it: the occlusions determined from the foreground objects with respect to the background objects cannot be directly filled. To be able to make the scene extrinsic, namely make it usable from any point of view, usually one proceeds through triangulation algorithms of the Delaunay type.

Through this passage, each pixel, after having been declared in its three 3D coordinates, is connected to other two pixels through segments called edges in order to form a triangular face, generally characterized by a normal, which determines its orientation in space. Each vertex is shared by many faces.

In particular, the Delaunay triangulation proceeds with these steps: given n points in a plane, they are joined with segments so that every region inside the Convex Hull is a triangle.

The Delaunay triangulation is a planar graph. To build the Delaunay triangulation, it is enough to trace a segment between every pair of points, which share an arc. This process divides the convex envelope into triangles. Every point is thereby connected through an arc with its nearest points.

Managing Data in the Program Used Through Meshes of Polygons

Data coming from various scans are collected in a data structure created and managed by the program for managing 3D acquisitions on which one has worked. The meshes have been computed from clouds of points and have been afterwards subjected to triangulation. The triangle is the simplest convex polygon and due to this it is chosen as reference.

The triangulation allows performing a series of graphic operations which would not be possible only with the clouds of points, such as for example applying surfaces, colors and texture, computing area, perimeter, filling holes, removing irregular parts and removing inaccuracies of data detected by the scanner.

The most complex surfaces need more triangles to be represented. The greater the number of triangles, the better the capability of the model to represent the details.

A mesh of polygons is composed of a collection of sides, vertexes and polygons mutually connected so that each side is shared by two polygons maximum. A side connects two vertexes, and a polygon is a closed sequence of sides. A side can be shared by two adjacent polygons, a vertex is shared by at least two sides, and every side must finally be part of some polygon.

A mesh of polygons can be represented in different ways; moreover, different representations can be used also inside a single application. In fact, it is possible to choose a representation for external storage, one for internal use, and another one to interactively create the mesh.

The basic criteria for evaluating the different representations are the cost in time and in space of the representations themselves. The typical operations on a mesh of polygons are:

finding all sides incident on a certain vertex;
locating the vertexes connected by a side;
finding the sides of a polygon;
displaying the mesh;
identifying possible errors in the representation (for example missing vertexes, or sides, or polygons).

As regards the representation of meshes of polygons, there are three possible types of representations of meshes of polygons.

In the explicit representation, every polygon is represented by a list of coordinates of vertexes: $P=((x1, y1, z1), (x2, y2, z2), \ldots, (xn, yn, zn))$.

Vertexes are stored in the order according to which one would want to meet them when moving along the polygon. In other words, the pairs of following vertexes are connected by sides; moreover, there is a side which connects the last vertex of the list to the first. For a single polygon, this representation is efficient in space; for a mesh of polygons, instead, some space is uselessly employed, because the coordinates of the shared vertexes are stored twice. Moreover, there is not an explicit representation of the shared sides and vertexes. For example, in order to drag a vertex together with all sides incident thereon, in a typical interactive application, one has to find all polygons, which share the selected vertex. This search requires different comparisons between the coordinates of the vertexes of a polygon and those of all other polygons. The most efficient method to carry out this task would be ordering all N coordinates, operation which requires, in the best of cases, a time on the order of N log 2 N.

Moreover, there is also the chance that, due to rounding owing to computation, the same vertex can has different coordinate in every polygon. As regards displaying, this representation requires the transformation of every vertex and the clipping of every side of each polygon. Moreover, the shared sides are drawn twice, and this can insert inconveniences due to overwriting. In the polygons defined using the pointers to lists of vertexes, every vertex of the mesh of polygons is stored in the list of vertexes $V=((x1, y1, z1), (x2, y2, z2), \ldots, (xn, yn, zn))$ only once.

A polygon is therefore defined by a list of pointers to the list of vertexes.

This representation has several advantages. Firstly, it guarantees a strong saving of memory space. Moreover, the coordinates of a vertex can be easily modified. On the other end, however, it is still difficult, from the point of view of computations, to find the polygons which share a side, and the shared sides are again drawn twice.

These two problems can be removed by explicitly representing the sides, as occurs in the representation through pointers to lists of sides. In this case, there is still a list V of vertexes, but the polygon is represented by a list of pointers to a list of sides, wherein each side appears only once. Moreover, next to each side in the list, there are two pointers to the pair of vertexes, stored in the list of vertexes, which define its ends, and one or two pointers to polygons to which the side belongs.

Therefore, a polygon is described from the list $P=(L1, L2, \ldots, Ln)$ and a side from the list $E=(V1, V2, P1, P2)$. When a side belongs to a single polygon P1 or P2 will be null.

The polygons are represented on the display by displaying their sides, in order to avoid redundant clipping and scan conversion operations.

In none of the three representations, the determination of the sides incident to a certain vertex can be made efficiently: all sides must be inspected.

Obviously, it is possible to add explicit information to allow determining these relationships in a more efficient way.

Representing Data in the 3D Acquiring Program

The choice which has been made in the managing software of 3D data is keeping a list of sides, a list of vertexes, a list of triangles of the object and an optional list of triangles which point to each vertex, created and devised for processing and data managing needs.

To remove the redundancy of vertexes, the first thing that has been made is building a list of the vertexes (without repetitions) using an array "Vt".

In this way, doubling of vertexes is removed, but not on the sides: a side belonging to two triangles is stored twice.

Incidence searches continue to be complex.

A second step has been removing the redundancy of the sides. A list of the sides (array "Et") has been built, ordered on v1 and then v2, each composed of two integers indicating the position, in the array of vertexes, of the two vertexes incident on the side.

For example, the side 11 points to the two vertexes a and b, the side 12 points to vertexes b and c and so on.

As regards the list of triangles ("Tt"), it contains all triangles in an array of polygons "Tpol". Every triangle has an information about its normal (components Nx, Ny, Nz), the texture indexes (if present) and an array containing three integers which represent the positions in the array of vertexes "Vt" of the vertexes belonging to the triangle.

As regards the additional optional list of triangles which point to each vertex, it is composed of a vector of integers containing the indexes of the vertexes used by every triangle.

Correcting the Defects of Acquiring with Rebuilding of Missing Areas

Data obtained by scans of 3D models typically contain missing parts and empty spots or "holes".

These can be caused by scans with artifacts or by too deep recesses on the model which cannot be observed with a particular scanning angle.

Moreover, the empty spots can be caused also by low reflection (for example parts which reflect the laser ray due to material of which they are composed), by limits which deal with positioning the scanner laser or simply by missing views.

As regards the techniques for rebuilding surfaces in scanned models, the majority of works performed for rebuilding the missing areas is based on a volumetric representation of the objects.

The filling of holes can be performed as post-processing operation, applied after the rebuilding of the surface or can be integrated in the rebuilding algorithm of the surface. In this second case, a distinction must be made between rebuilding algorithms which operate on connected meshes of a set of samples and algorithms which operate on clouds of points in 3D.

Filling as Post-Processing

In order to fill areas of a surface just reconstructed, a widely used approach is triangulating each connected component of the surface, in order to obtain a polygonal mesh and only afterwards filling each empty spot with a certain chosen algorithm.

Rebuilding Based on Meshes with Filling of Empty Spots

In such case, every scan is treated as a Range Image. An algorithm of this type, widely diffused in literature, is the one created by Curless and Levoy (VRIP). With this method, the space is represented with a set of elementary cubes (voxels) and not with surface elements (pixels). The idea underlining every volumetric method is assigning a function D(x) to points in space, sampling it next to the voxels into which the space is divided and extracting a surface implicitly defined by D(x)=s, where s is a given threshold. The function D(x) is the distance with sign between point x in space and object surface.

The sign points out the position of the point with respect to the object: internal and external points will have opposite signs. When function D(x) is computed, the iso-surface can be easily extracted, namely the surface with threshold s=0, therefore at a null distance from the object. It corresponds to the best approximation of the searched model.

$$D(x) = \frac{\Sigma w_t(x) d_t(x)}{\Sigma w_t(x)}$$

$$W(x) = \Sigma w_t(x)$$

where D(x) is the implicit function being searched and W(x) is the cumulative function of weights assigned to each vertex of the surface. x is the point whose distance from the surface has to be computed; d(x) is the distance between point x and mesh M, wi(x) is the weight associated with the i-th point p, intersection between mesh and the straight line starting from the sensor of the measuring system and passing by point x.

To the voxels of the volume containing the object, one of three statuses is assigned: not visible, empty or next to the surface. The steps of the algorithm are as follows:

1. All voxels are initialized to the not visible status.
2. A distance function is assigned to voxels next to the surface, as described above.
3. Lines are followed, which join the measuring sensor to points of the mesh and the empty status is assigned to voxels outside the surface. This process is called space carving.
4. In addition to extracting a iso-surface at distance d(x)=0, a surface is extracted between voxels with empty status and voxels with not visible status.

The result is obtaining an intersection of all points recognized as internal to the surface, to which the not visible status is assigned. The final surface is extracted not only where d(x)=0, but also between the points evaluated as external, or with empty status, and those internal ones or with a not visible status.

Rebuilding from Clouds of Points with Filling of Empty Spots

The third method treats with the union of all scans as a single disorganized set of 3D points, which must be adapted to a continuous surface. In this way, a single surface is created and the empty spots are simultaneously removed, integrating information coming from the laser scanning.

In case of a voxel-type volumetric display, in literature often a polygonal representation is used for the surface obtained through the algorithms of the marching cubes and of the dividing cubes.

Correcting the Acquisition Defects in the Managing Program of 3D Data

For this purpose, an algorithm is used for filling empty spots made for the managing program of 3D data.

A volumetric method has not been used, but information deriving from the triangulation of meshes and from the edge sides computed as lines to which a single triangle points, has been taken into account.

Various algorithms have been made before coming to a satisfactory rebuilding of the surfaces.

All algorithms are capable of filling many holes present in the selection if belonging to a single object. If surfaces belonging to many objects are selected, an error screen is displayed.

For the operation of the various algorithms, an active selection is necessary on the surface part, which comprises the bug. First of all, the edge sides are computed which are inside the manually performed selection, and they are put in an array of sides which is passed to an external function for processing. This latter one operates for controlling whether the sides belong to a closed contour and whether a single closed contour exist or if there are many contours in the selection.

The sides are ordered so that the vertex v1 of the first side placed in the array is equal to the vertex v2 of the contiguous side in the array.

If the vertex v1 of the side contiguous to the i-th side is v1, it is inverted with v2 and consequently v2 with v1, to be able to perform checks on consecutive sides always on vertex v1.

What is passed for reference to the main algorithm is a new array of ordered sides belonging to a single contour (if present).

The used recursive algorithm does not add points to the object, but closes the bug by joining the vertexes of the contour with a certain sequence, in such a way as to triangulate the empty spot. The main purpose has been filling the holes areas, not taking into account the possible overlapping of the sides of the bug contour.

With this algorithm, like with the other made ones, it is possible to detect the presence of branches in a bug, but differently from the following ones, the presence of intersections between the sides of the contour is not checked.

The vertexes belonging to more than one closed contour are considered "branches".

The main steps of this algorithm are:

the search of the first side in the array of sides and of the vertex v1 of the consecutive side;

the formation of a new triangle using v1 and v2 of the i-th side and v1 of the side (i-th+1);

the iterative addition of further triangles for filling the whole area of the empty spot;

the computation of normal lines to triangles;

the copy of the indexes of the textures associated with the triangles;

a further check for the search of other contour sides and the possible filling of the other closed areas.

The problems that this type of process has given are related to the possible presence of intersections between the edge sides as already mentioned and the external vertex-vertex union for forming a new triangle, not taking into account internal obtuse angles.

A second algorithm being made, called barycentrical, deals with filling the empty spots present on the selected surface by computing for each one of them the barycenter and then creating new triangles inside the various holes.

The algorithm is capable of filling all empty spots present in the selection because it cyclically search for the closed contours inside the mesh, till none is found.

Each empty spot is taken into account and filled differently and independently from the other ones being present.
1. The barycenter consequently is computed by suitable applying the averaging operation to the coordinates x, y and z of the various vertexes of the bug. A new vertex is thereby obtained, which is added to the vector of total vertexes of the object (Vt).
2. Afterwards, the barycenter of all new virtually created triangles is computed; only at that time, the total list of total triangles of the object (Tt) is updated.
3. The only triangles added are those which have as vertex the barycenter computed in step 2.

These totally cover the surface of the empty spot and make the object mesh thicker in that area, with respect to the triangles obtained in step 1.

As already stated, the algorithm, after having closed a bug, searches for another possible bug inside the performed selection. According to the same process of the previous algorithm, if a branch is not found, the closed surface upstream of the branch and the downstream one (if they exist) are considered as two different holes.

This algorithm for rebuilding the surfaces has been inserted in the final version of the program and its use is advisable for empty spots of the circular, elliptic shape and the like.

It instead works incorrectly if the holes have a "U" shape, since in this case the barycenter of the hole falls in the surface part already subjected to triangulation or anyway creates intersections between the sides.

The optimized recursive algorithm is inserted in the final version of the managing program for 3D data.

The major difference with respect to the previous recursive algorithm is the introduction of a voxel creating device often mentioned in literature for subjecting the polygons to a triangulation.

The voxel creating device allows filling simple concave polygons, thereby covering the majority of possible situations on a holed surface.

The only particular condition which is not dealt with and solved is the presence of a closed contour inside another one, namely the presence of an "island" inside a hole.

Instead, the following cases are solved:
external unions caused by the presence of obtuse angles inside the hole surface
union with possible intersection of the sides
self-intersecting contours (signals the wrong contour and stops).

An additional complication, with respect to the previous recursive algorithm, has been having to take the points (vertexes) of the closed contour from 3D to 2D to verify possible intersections between the sides.

The N 3D vertexes belonging to the green sides being considered have already been ordered, since they are the vertexes v1 of every side of the contour arranged in the array of ordered sides (Ec).

The vertexes are projected in a plane searched as the "best plane described by the N 3D points".

The equation of a generic plane in the space is:

$$Ax+By+Cz+D=0$$

where A, B, C are the coefficients which define the normal line to the plane.

The coefficients are computed according to the following expressions:

$$A = \frac{1}{2}\sum_{i=0}^{N-1}\{(z_i + z_{i+1})(y_{i+1} - y_i)\}$$

$$B = \frac{1}{2}\sum_{i=0}^{N-1}\{(x_i + x_{i+1})(z_{i+1} - z_i)\}$$

$$C = \frac{1}{2}\sum_{i=0}^{N-1}\{(y_i + y_{i+1})(x_{i+1} - x_i)\}$$

They are then standardized to obtain D in the correct form:

$$A = \frac{A}{\sqrt{(A^2 + B^2 + C^2)}}$$

$$B = \frac{B}{\sqrt{(A^2 + B^2 + C^2)}}$$

$$C = \frac{C}{\sqrt{(A^2 + B^2 + C^2)}}$$

$$D = \frac{(Ax + By + Cz)}{\sqrt{(A^2 + B^2 + C^2)}}$$

When the 2D coordinates are known, they are saved in a vector belonging to a data structure which has three fields: two float x, y for the coordinates and an integer id for storing the value of v1 of the side, namely the position of the vertex in the vector of total vertexes of the object (Vt).

The first performed check deals with the self-intersection of the contour sides. If this search provides a negative result, it is checked whether the 2D vertexes are stored with clockwise or counterclockwise movement direction on the contour.

If the direction is counterclockwise, the vector is reversed.

A very important function, created for the correct operation of the voxel creating device, deals with computing all N internal angles formed by every pair of sides of the contour.

In order to store each angle value (measured in radiants) a similar structure to the one of 2D vertexes is used.

In such case, the angle value is saved in x and the value of the vertex related to that angle is saved in id. Field y is used afterwards for processing.

Once having obtained all angles, the first angle of the array is compared with all other angles, to search for the one with the maximum value.

This search has been performed to decrease the number of obtuse angles since the first steps of the algorithm.

The first triangle being created will be the one with angles 200°, 83° and 77°.

When the maximum angle is known, further checks are performed.

It is checked that the new segment, joining the vertex related to the maximum angle and the following vertex of two positions, has not been built outside the hole.

The segment that has to be created is analyzed to add a triangle to the object structure, so that it does not intersects any of the already existing green sides of the contour.

If one of these checks provides a positive result, the current maximum angle must be marked (using field y of the data structure used for the angles); a new maximum angle is searched among the remaining ones and the cycle starts again.

If instead no particular cases occurred, the three id are added, pointing out the indexes of the necessary vertexes for a new triangle, to a data structure containing a three-position vector.

The 2D point in the following position to the one with maximum angle must be deleted, because from now on this will not be any more a vertex belonging to the contour sides.

The algorithm cyclically operates as far as there are more than three edge vertexes. When only three vertexes are found, they are inserted in the structure containing the vertexes in triplets for the new triangles.

These last ones will be added to the list of total triangles of the object (Tt). In the main part of the algorithm, the normal lines of the new added triangles are computed (based on the knowledge of the normal lines of the triangles adjacent to the contour) and the texture indexes (if present).

The final result is a voxeling applied to a polygon.

The improvement provided by the triangulation with the voxel creating device is clear.

Figure 2:
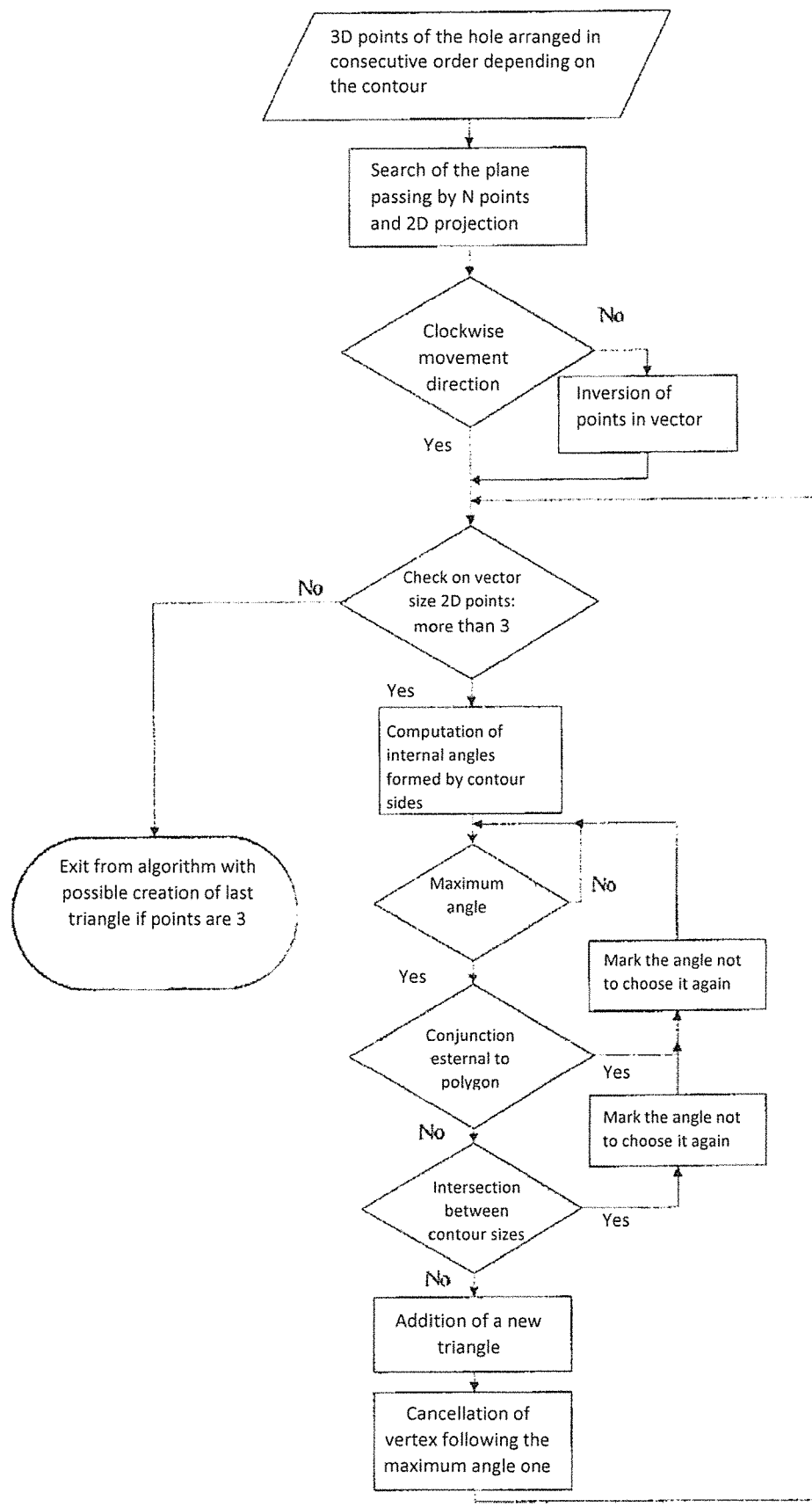
FIG. 2 is a flow diagram which shows the operating scheme of the recursive algorithm.

Finally, FIG. 2 shows a flow diagram with the operating scheme of the recursive algorithm.

The integration of various 3D images acquired with a scanner laser is the central step of many software applications. Assembling the various views in a single polygonal surface is an operation, which requires a very heavy computation, particularly if the 3D surfaces 3D are modeled with the voxels, as can be often found in literature.

Locating exactly where the points of an object A intersect the points of an object B in the tridimensional space is much more complex with respect to the two-dimensional case.

In the 3D the sides of A can pass below or above the sides of B without their surfaces mutually touch, giving anyway the visual idea of an intersection.

Herein below the methods implemented for rebuilding of surfaces starting from da range images are described.

Works published in literature dealing with the integration of many meshes can be classified into two big classes: structure method and non-structured methods.

The non-structured integration is made by joining together all points deriving from the laser scans, then supplying them to a polygonal rebuilding procedure.

The Delaunay triangulation of a set of points in the 3D space has been proposed as basic method for rebuilding.

Structured integration methods use information dealing how each point has been obtained, using the error limits on the position of a point or nearness information between the points within a certain range image. The Soucy and Laurendau algorithm, widely known in literature, uses a structure integration technique to combine multiple images.

This is a parametric method because it performs a re-parametrization of the range images.

It has been seen that a range image is a collection of points (x; y; z) organized as a matrix. A plane is associated with each one of them, which is an image plan on which the object points have been projected, and a normal line to the plane, whose direction depends from the position of an observer. Often it is convenient to describe the surface as a matrix of points distributed on a regular grid in a two-dimensional parametrized space. The passage from the tridimensional space to a two-dimensional space must keep the injectivity characteristics: at most one point in the 3D space must correspond to one point in the 2D space.

As regards the parametrization on a two-dimensional plane space, the plane on which the parametrization (also called interpolation) occurs can be the image plane of the range image or any plane.

The Soucy and Laurendau algorithm is based on canonic subsets of the range images. The term canonic subset of K range images means the points present in all K images, obtained by the intersection of these images and absent in the other images.

By distinctly modeling all subsets, portions of surface are obtained which wholly describe the object and which do not mutually overlap. This approach however has a problem: in this way, it is not easy to model the surface areas corresponding to the edges between a subset and another, which result separate.

The Soucy and Laurendau algorithm is one of the first algorithms which have solved the problem of computing a surface starting from different range images.

The Turk and Levoy algorithm is another approach to the integration problem.

The basic idea consists in the removal of the overlapped parts to obtain portions of surface which are used to form the final model.

The algorithm can be divided into four following steps: given a pair of
range images A and B:
1. The areas of the meshes which overlap are removed.
2. Zippering is performed, namely the two parts are joined through clipping, "cutting" operation of one of the meshes.
3. The smallest triangles which can be obtained in the second step are removed.
4. The thereby obtained vertexes are moved towards a "consent position".

The process for removing redundant areas operates in this way: the triangles on the edges of the meshes are examined and are removed if redundant.

The process goes on till there are no more redundant triangles. Given a triangle of A, it is redundant if one of its vertexes is within a limit distance from B. Two meshes are obtained which partially overlap only next to the edges. Now this zippering operation joins the obtained surface areas.

The main operating steps of the algorithm are:
creating a new object with the modifications due to the application of the algorithms for filling the empty spots or for joining two objects. If the creation of new objects has not been chosen, the modifications are performed on the starting object/objects;
integrating and joining two meshes;
choosing a distance threshold from the single plane on which each triangle of object A lays with respect to the points of object B. It has been established at software level that the distance threshold refers to a virtual plane above and a virtual plane below the plane of the single triangle;
considering as removable also the points of B which lay outside the triangles of A, but within a certain distance, fixed by such threshold. The two thresholds have been set at default values which are the suitable results for the scans used as test;
removing the parts of surfaces which overlap.

It is necessary that only two objects are visible for the algorithm to operate.

All this is explained in detail below and includes the use of the previously established thresholds.

It is possible to create a single object starting from two previously saved different objects, or to which the algorithm for removing overlapped areas has been applied. In this case, it is necessary that there are two visible objects.

If a single object is visible, it is possible to join the two strips of the object which is displayed, in such a way as to completely cover that part of surface which, due to the removal of overlapping, is currently without triangulation.

As regards the integration method, to be able to remove real overlapping and deep overlapping, it has been necessary to work on objects subjected to triangulation, because it is necessary to have information of the list of total triangles of an object and of the list of sides.

The performed algorithm consists in a series of major steps, each one of which will be explained in detail below:
1. Removing the overlapped portions of two meshes
2. Joining the two meshes in a single new mesh
3. Filling the internal area to the two contours obtained with the addition of further triangles 1. Removing the Overlapped Portions of Two Meshes Before being able to join two acquisitions or two objects previously saved in a single file, it is necessary to remove the triangles of a mesh which lay, within a certain tolerated distance, inside the other mesh.

As starting point for studying overlapped surfaces, two rectangular surfaces arranged perpendicular to axis z have been created and inserted in the managing program for 3D data.

The two surfaces have been used to try and remove the overlapped areas in the 3D space.

If the two surfaces are seen frontally, they seem overlapped while, if slightly rotated, they appear as two different objects which lay on two different planes of the 3D space.

Like these two surfaces which overlap only visually, also the acquisitions obtained through scanner laser can mutually intersect only visually.

In order to better under stand what is meant as visual intersection or depth overlapping, always two objects A and B can be taken as reference and one can think of build a surface above and a surface below A and afterwards verify the presence of points of the contour of B inside the object that is being created.

In this way the presence and use of a distance threshold from the plane is clarified.

In order to remove further edge vertexes of B present outside the object A, a second threshold is introduced.

These points are in strict nearness to the contour of A and due to this, if they remain in the final object, can result an obstacle to joining the contours of the two objects which will be performed afterwards.

According to an example of situation similar to the described one, the second threshold serves to allow a user to also remove some external vertexes. With a certain threshold value, the vertexes pointed out with a red circle can be removed. This operation is possible also after having performed the algorithm already one time; in fact, by performing the algorithm again, the external vertexes would be removed, since they are deemed an obstacle for a good union result.

A difference of the Turk and Levoy zippering algorithm in which only the vertexes of one of the two objects are removed in the overlapping area, in this algorithm the vertexes of both objects are removed.

To be able to perform this operation, the two objects are cyclically reversed, passed as reference to the function which removes the overlapping. Visible objects must necessarily be only two so that it can be possible to use the described algorithm.

The first operation which is performed inside the algorithm is the local copy of the edge vertexes of an object and the copy of the list of triangles and of the list of vertexes of the second object.

Taking as reference two objects A and B, the second above mentioned object will not always be the object B, rather will be once B and afterwards A.

Differently from the algorithms for rebuilding the missing areas, in this case it is not necessary to operate a certain selection on the overlapped portion, because information deriving from the list of sides in the selection is not used.

For this reason, the computations are not very high, since the check on the overlapping must be performed for all triangles of an object and for all edge sides of the other object.

After having copied all edge vertexes of an object in a local vector and all vertexes and the triangles of the other object in other local vectors, a preliminary check is performed.

It is checked in fact whether the distance between the center of gravity of the j-th triangle of the second object and the i-th edge vertex of the first object is the greater of a length f obtained as:

$$f = c + d$$

where c=distance between the center of gravity and the vertex of the triangle which is further from the center of gravity and d=distance threshold from the plane.

If this computation provides a positive result, then the i-th vertex is discarded for the triangle in question, otherwise the algorithm is performed, because the vertex is inside a portion of the 3D space 3D restricted to a region near the triangle.

Only then the current triangle is projected from 3D to 2D (more precisely it is projected in the plane to which its three vertexes belong).

The projection of the triangle in the plane is performed using the equation of a plane in the 3D space (Ax+By+Cz+D=0) and transporting it, with the help of transformation matrixes, the 3D coordinates of the vertexes into 2D coordinates.

Moreover, the i-th contour vertex is projected on the plane of the triangle of the opposite object (the one marked by the coefficients A, B, C and D computed in the previous step) and it is checked whether the vertex falls within the region of space delimited by the distance threshold from the plane.

If the vertex is inside this region, the integer variable a belonging to that vertex is placed to −1 (it will be used for the following creation of the triangles) and, in a further vector of integers, −1 is stored in the position related to this vertex.

Otherwise, one goes on with a further check on the vertex, testing whether this latter one, in addition to belonging to the region of space delimited by the "plane distance threshold", is also inside the triangle.

In order to know whether a certain point is outside or inside the triangle taken as object, a function is made which checks, starting from the coordinates of the three vertexes of the triangle, when a point is internal, external or on the edge of the same.

From the algebraic point of view, a straight line divides the plane into three sets of points: two half-planes and the straight line itself.

The points of the Cartesian plane are then divided into the three sets according to the value of the polynomial $P(x, y) = ax + by + c$. Namely, if $P(x, y)$ produces a positive value, the points belong to a half-plane, if negative they belong to the opposite half-plane, and if null, they lay on the straight line with equation $P(x, y)$.

Given two points P0 (x0, y0) and P1(x1, y1), the canonic (or implicit) equation of the straight line passing by to two points is:

$$x(y0-y1)-y(x0-x1)+x0y1-x1y0=0$$

The polynomial, first equation member, is null on the straight line, while it will provide positive values on a half-plane and negative values on the other half-plane.

The function PuntoInternoTrg(std::vector<punti2DF> trng) checks whether a point p is outside, on the edge or inside the triangle of vertexes a, b and c.

The function PuntoInternoTrg receives as arguments the coordinates of the vertexes a, b, c of the triangle and those of the point p to be checked.

With the function Segno it is checked whether the point p belongs in any case to the same half-plane which contains the third vertex with respect to the straight line passing by the other two: the product is positive when p and the third vertex belong to the same half-plane.

The products of the functions Segno, recorded in the control variables s1, s2 and s3, are then used to establish the position of point p with respect to the triangle of vertexes a, b and c.

s1, s2, s3 in fact contain the position of p with respect to the three sides.

If the value of the control variables is in at least one case negative, point p is outside the triangle.

If the check values are all positive, the point is outside the triangle. Finally, when no value is negative, but in some case is null, the point is on the edge of the triangle.

Figure 3:
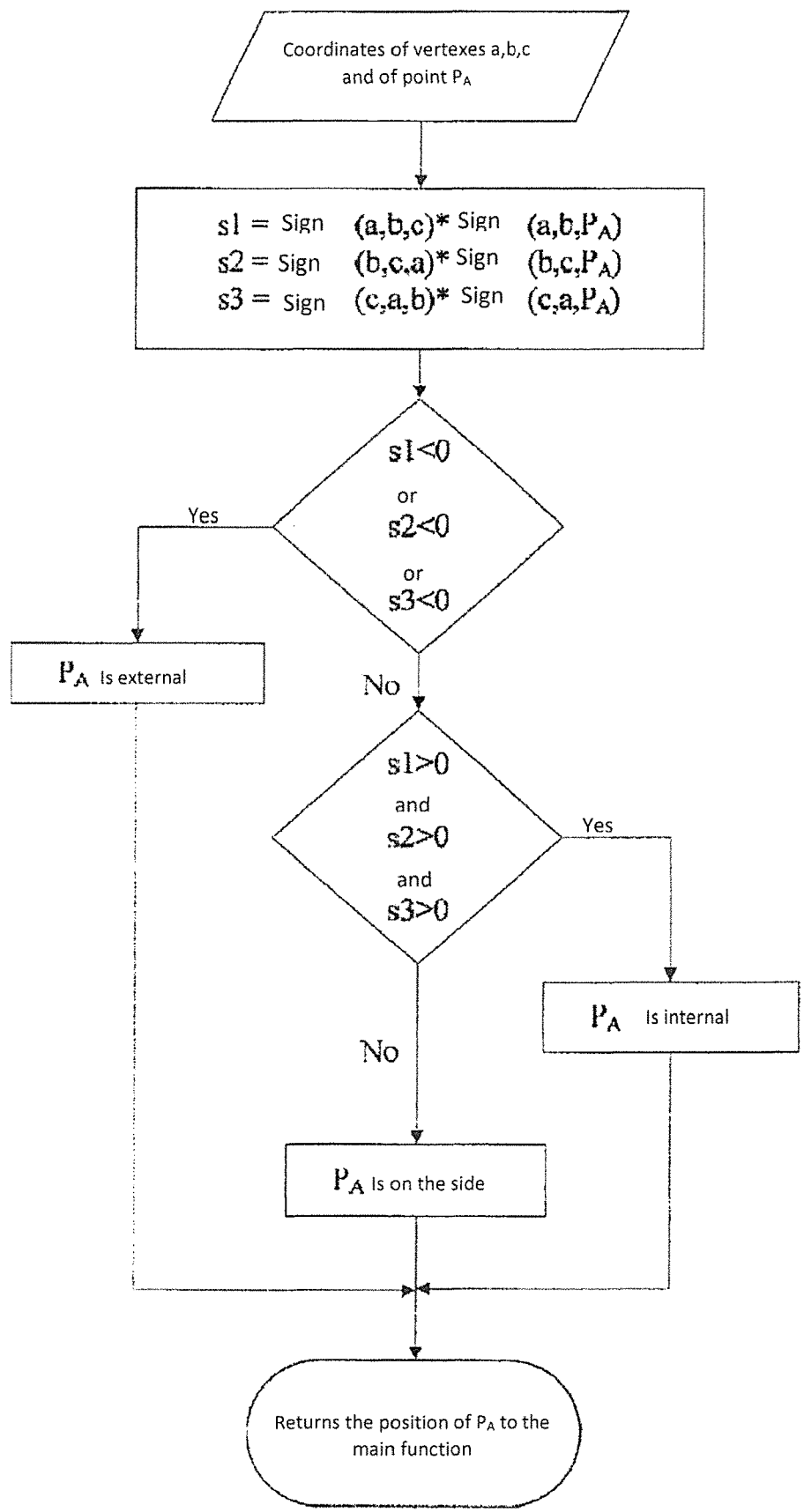
FIG. 3 is a flow diagram, which describes how the position of a point with respect to a triangle is verified.

FIG. 3 shows a flow diagram which describes how the position of a point with respect to a triangle is verified.

If the vertex is internal, variable a of the vertex is set to −1.

If the vertex is not internal, it is anyway verified whether the vertex is within the distance "soglia esterno trng". For this, a parametric equation is computed for a segment in the plane. It is computed for each side of the triangle.

This series of checks on the j-th triangle of the first object is performed for each vertex of the second object. After having ended the N vertexes, the (j-th+1) triangle is analyzed with all vertexes which do not appear with value −1 in vector "verticieliminare".

After having ended the checks on the triangles of an object, its new list of vertexes and the list of triangles remained after removing the various vertexes, are created.

Then the two objects A and B are inverted (by exchanging the pointers) and this time it is checked whether the vertexes of A are overlapped to the triangles B.

To understand when the search for overlapped vertexes must be ended, at every cycle it is compared whether the size of the vector of total triangles of the modified object is the same of the new vector with the remained triangles. If the two sizes are the same, vertexes have not been removed from the object to be "modified" and therefore the search will not be performed any more in the following cycle for that object.

As regards the display of final objects, two situations can occur:
 it has been chosen to create two new objects and in such case the new objects are made visible while the starting one are made non visible;
 the modifications will be performed to the original objects.

Herein below some examples of application of different threshold values of the main interface Riempi buchi Unioni are included.

The result is anyway the one of obtaining two new objects according to the threshold values set at the beginning which must now be joined in a single object.

2. Joining the Two Meshes in a Single New Mesh

To create the missing surface in the area between the contours of the two objects, it has been decided to join these two in a single new object which will be added to the list of objects. The two objects become non visible while the new created object will be the only visible one.

3. Filling the Internal Area to the Two Contours Obtained with the Addition of Further Triangles To integrate the portion of space between the contours of the two objects, remain empty after having removed the overlapped vertexes, it is possible to add triangles which cover the difference created between the two strips.

To do this, a selection of the chosen region of space is necessary.

The selection must be performed in order to comprise the green sides of two contours only or of a single contour shaped as a 'U'.

If more than two edge branches are selected, no space area is subjected to triangulation and the irregularity is signaled in the console generated by the main program when it is opened.

The triangulation of the portion inside the contours of the two objects is performed by using the previously described recursive algorithm.

The application of the recursive algorithm is possible only on closed contours.

For this reason, in order to fill the portion between the two branches, two further sides are added to the vector of edge sides:
 the one created by joining the first vertex of the first branch with the ending vertex of the second branch which is nearest thereto;
 the one obtained by joining the last vertex of the first branch with the remained ending vertex of the second branch.

If the selection is performed on a 'U' contour, the first vertex is joined with the last one to create the necessary side for closing the region of space. In order not to risk joining two vertexes of a rectilinear contour, a check is performed on the branch length: if the distance between the two end vertexes is lower than half the length of the branch, then one proceeds with closing and with the triangulation.

As regard the filling of empty spots with an island of points at the center, none of the algorithms being described is capable of removing empty spots with parts of surface inside them, namely islands of points subjected to triangulation at the center of a hole.

When making the joining algorithm of the contours, in fact, it has been possible to do without the lack of previously described methods.

Using the joining algorithm of two green branches, an empty spot containing an island of points can be removed. Initially, one can proceed by joining part of the contours of the empty spot in order to obtain a hole.

Afterwards, by applying the recursive filling algorithm on the surface now composed of a single closed contour, the empty spot is totally removed from the.

The inventive process further comprises the following steps:
 selecting the color of the vehicle, or making a customized color and inserting its related values;
 inserting data related to primer painting layer and transparent painting layer;

inserting data related to other consumable materials normally used during the painting process; and computing the cost of the usable and consumable materials for painting motor vehicles, from the analysis of the deformations in the motor vehicles.

With the above described process, a comparison is performed between the data of relevant images with the image of the damaged vehicle and the relevant image data with the image of the sample vehicle, the damaged and/or distorted regions being identified from the difference of the image data between the image data relevant for the damaged vehicle and the image data relevant for the sample vehicle.

Moreover, the selection of the image data of the sample vehicle from a database of images of sample vehicles is performed automatically, the image whose image data are different by a minimum amount from the image data of the selected vehicle being selected as image of the sample vehicle.

Image data are composed of a three-dimensional array of image data, every element of such array being univocally related to image pixels of a two-dimensional image according to a plane passing through such pixel and the comparison of the image data of the damaged vehicle and the comparison between the image data of the wide sample vehicle being composed of the comparison of image data which in the two arrays of image data have the same position.

In the inventive process, the area and/or the volume of the image region is computed which is relevant for the image pixels of vehicle coinciding with the damaged region, which region is determined by selecting means and/or by automatically comparing the image data of the damaged vehicle with the image data of the sample vehicle.

Moreover, a virtual image of a sample vehicle is produced, which is composed of the set of virtual images of single structural parts of a vehicle which form independent structural units, namely individual parts of a vehicle, which virtual image can be displayed as image of the assembled vehicle or as exploded image of the vehicle and/or as transparence image of the damaged vehicle in which the images of hidden parts are also displayed, every structural part of the vehicle being univocally identified by an identifying code.

And still more, at least one external view of the vehicle is also defined, preferably various external views of the vehicle taken from its different sides and/or in perspective and at least one internal view of the vehicle, preferably various internal views of the vehicle similarly to the external views, being it possible to graphically select one or more structural parts of the vehicle for their identification as damaged parts or one or more structural parts of the vehicle being identified as damaged parts through an automatic comparison between virtual images of the sample vehicle and virtual images of the damaged vehicle.

In particular, one or more images of the damaged vehicle are acquired also from inside it, namely one or more images of the damaged vehicle inside.

What is claimed is:

1. The method of computing a cost of usable and consumable materials for painting of motor vehicles, from an analysis of deformations in the motor vehicles, said method comprising the following steps:

loading damaged vehicle image data based on at least one three-dimensional image of a damaged vehicle into a vehicle images memory;

recalling sample vehicle image data based on at least one three-dimensional image of a sample vehicle from a database of images of sample vehicles, said sample vehicle being a type of vehicle corresponding to the damaged vehicle;

displaying the damaged vehicle image data and the corresponding sample vehicle image data;

automatically comparing the damaged vehicle image data with the corresponding sample vehicle image data;

identifying, through said automatic comparison damage position and deformation regions;

selecting, through graphical tools for delimiting or pointing out, the deformation regions identified from the automatic comparison;

storing image pixels corresponding to the deformation regions in a memory of a working program;

computing perimeter, area and/or volume of deformation regions from the stored image pixels using a computing algorithm implemented by the working program;

computing labor times and costs for repairing the deformation regions based on the computed perimeter, area and/or volume, using a database of available repair times and costs for types of vehicle; and producing a virtual image of the sample vehicle which is composed of a set of images of the sample vehicle, which virtual image is displayed as an image of an assembled vehicle or as an image of an exploded vehicle, structural parts of the virtual image being univocally identified by an identifying code, and corresponding to structural parts of the damaged vehicle;

characterized in that the step of computing perimeter, area and/or volume of the deformation regions is performed through the following steps:

acquiring damaged vehicle image data through laser scanning;

post-processing the acquired data, comprising the substeps of a) aligning scans, b) cleaning a cloud of points and filtering noise, c) triangulation and building mesh, d) closing holes of the mesh and correcting anomalous faces, and e) forming a 3D model and applying textures to the 3D model;

displaying the 3D model;

managing data in the computing algorithm used through meshes of polygons;

showing data in a 3D acquiring program;

filling as post-processing;

rebuilding based on meshes with filling of empty spots;

rebuilding from clouds of points with filling of empty spots;

and in that the working program further implements the following steps:

selecting a color of the damaged vehicle, or making a customized color and inserting related values;

inserting data related to primer painting layer and transparent painting layer;

inserting data related to other consumable materials used during the painting process; and computing the cost of usable and consumable materials for painting motor vehicles.

2. The method according to claim 1, characterized in that a comparison is performed between the damaged vehicle image data and the sample vehicle image data, the deformation regions being identified by the difference between the damaged vehicle image data and the sample vehicle image data.

3. The method according to claim 1, characterized in that the selection of the sample vehicle image data is performed automatically, wherein the sample vehicle image data which is different by the least amount from the damaged vehicle image data is selected as sample vehicle image data.

4. The method according to claim 3, characterized in that the damaged vehicle image data are composed of a three-dimensional array of damaged vehicle data, and the sample vehicle image data are composed of a three-dimensional array of sample vehicle data, every element of said arrays being univocally related to image pixels of a two-dimensional image according to a plane which passes through said pixel and the step of comparing vehicle image data and sample vehicle image data is accomplished when the two arrays have the same position.

5. The method according to claim 1, characterized in that at least one external view of the damaged vehicle is defined, and at least one internal view of the damaged vehicle is defined, making it possible to graphically select the structural parts and identify them as damaged parts.

6. The method according to claim 1 characterized the steps are performed by at least one central processing unit (CPU) or central logic unit which performs the steps of:

performing steps of the method with a program,
storing said program in a memory,
storing image data of at least one vehicle in a memory,
providing at least one database of three-dimensional images of sample vehicles,
inserting of data or alphanumeric and/or graphic commands,
selecting damaged or distorted regions in said vehicle, and
printing and/or displaying results.

7. The method according to claim 6 characterized in that the step of selecting through graphical tools is performed by drawing a closed border line which surrounds the deformation regions and identifying as the image pixels a subset of pixels which fall within said border line.

8. The method according to claim 1 characterized in that at least one external view of the damaged vehicle is defined, and at least one internal view of the damaged vehicle is defined, making it possible to identify one or more structural parts of the vehicle as damaged parts during the step of automatically comparing.

* * * * *